(12) United States Patent
Stephens et al.

(10) Patent No.: US 8,006,141 B2
(45) Date of Patent: Aug. 23, 2011

(54) METHOD FOR SPEEDING UP SERIAL DATA TOLERANCE TESTING

(75) Inventors: Samuel G. Stephens, Austin, TX (US); Michael P. Baker, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 189 days.

(21) Appl. No.: 12/494,624

(22) Filed: Jun. 30, 2009

(65) Prior Publication Data

US 2010/0332931 A1    Dec. 30, 2010

(51) Int. Cl.
*G06F 11/00* (2006.01)

(52) U.S. Cl. ............ 714/704; 714/738; 714/25; 714/48; 714/705; 714/709; 714/715; 714/723; 714/724; 714/734; 714/739; 375/224; 375/225; 375/226; 702/69

(58) Field of Classification Search .................. None
See application file for complete search history.

(56) References Cited

U.S. PATENT DOCUMENTS

| | | | | |
|---|---|---|---|---|
| 6,076,175 A * | 6/2000 | Drost et al. | .................... | 714/704 |
| 6,934,648 B2 * | 8/2005 | Hanai et al. | ..................... | 702/69 |
| 6,986,091 B2 | 1/2006 | Moore et al. | ................. | 714/738 |
| 7,239,969 B2 * | 7/2007 | Tabatabaei et al. | ............. | 702/69 |
| 7,305,025 B2 | 12/2007 | Yamaguchi et al. | .......... | 375/226 |

* cited by examiner

*Primary Examiner* — John Trimmings
(74) *Attorney, Agent, or Firm* — VanLeeuwen & VanLeeuwen; David Dolezal (57) ABSTRACT

A receive test accelerator retrieves an adjusted jitter amount and an adjusted test time in which to test a device. The adjusted jitter amount and the adjusted test time correspond to an adjusted bit error rate that is extrapolated from a baseline bit error rate, which corresponds to a baseline jitter amount. In turn, the receive test accelerator tests the device, at the adjusted test time, using a data stream that is modulated by the adjusted jitter amount.

18 Claims, 12 Drawing Sheets

| | Data Rate | BASELINE TEST TIME (Baseline Jitter and BER $e^{-12}$) | ADJUSTED TEST TIME (Adjusted Jitter and BER $e^{-10}$) |
|---|---|---|---|
| 1240 | 1.25GB/s | ~2500 Sec for 95% Confidence<br>~8000 Sec for 100% Confidence | ~25 Sec for 95% Confidence<br>~100 Sec for 100% Confidence |
| 1250 | 3.0GB/s | ~1000 Sec for 95% Confidence<br>~4000 Sec for 100% Confidence | ~10 Sec for 95% Confidence<br>~40 Sec for 100% Confidence |
| 1260 | 8.0GB/s | ~400 Sec for 95% Confidence<br>~1600 Sec for 100% Confidence | ~4 Sec for 95% Confidence<br>~16 Sec for 100% Confidence |

Column labels: 1210, 1220, 1230

FIG. 12

METHOD FOR SPEEDING UP SERIAL DATA TOLERANCE TESTING

BACKGROUND OF THE INVENTION

1. Technical Field

The present invention relates to a method for reducing serial data tolerance test times for receiver devices. More particularly, the present invention relates to utilizing a data stream that is modulated by an increased jitter amount for testing a device to a less stringent bit error rate, thus reducing test time.

2. Description of the Related Art

Electronic devices such as receiver devices are tested to ensure that the electronic devices meet particular requirements, such as a bit error rate (BER) requirement. For example, a receiver device may be subject to a "receive jitter tolerance test" that requires the receiver device to pass a bit error rate of 1e-12 at 3.0 GB/second. The receive jitter tolerance test typically involves testing the receiver device at numerous "measurement points" for different process corners, voltages, and temperatures based upon the receiver device's specifications.

BRIEF DESCRIPTION OF THE DRAWINGS

The present invention may be better understood, and its numerous objects, features, and advantages made apparent to those skilled in the art by referencing the accompanying drawings, wherein.

DETAILED DESCRIPTION

Certain specific details are set forth in the following description and figures to provide a thorough understanding of various embodiments of the invention. Certain well-known details often associated with computing and software technology are not set forth in the following disclosure, however, to avoid unnecessarily obscuring the various embodiments of the invention. Further, those of ordinary skill in the relevant art will understand that they can practice other embodiments of the invention without one or more of the details described below. Finally, while various methods are described with reference to steps and sequences in the following disclosure, the description as such is for providing a clear implementation of embodiments of the invention, and the steps and sequences of steps should not be taken as required to practice this invention. Instead, the following is intended to provide a detailed description of an example of the invention and should not be taken to be limiting of the invention itself. Rather, any number of variations may fall within the scope of the invention, which is defined by the claims and equivalents thereof that follow the description.

Figure 1:
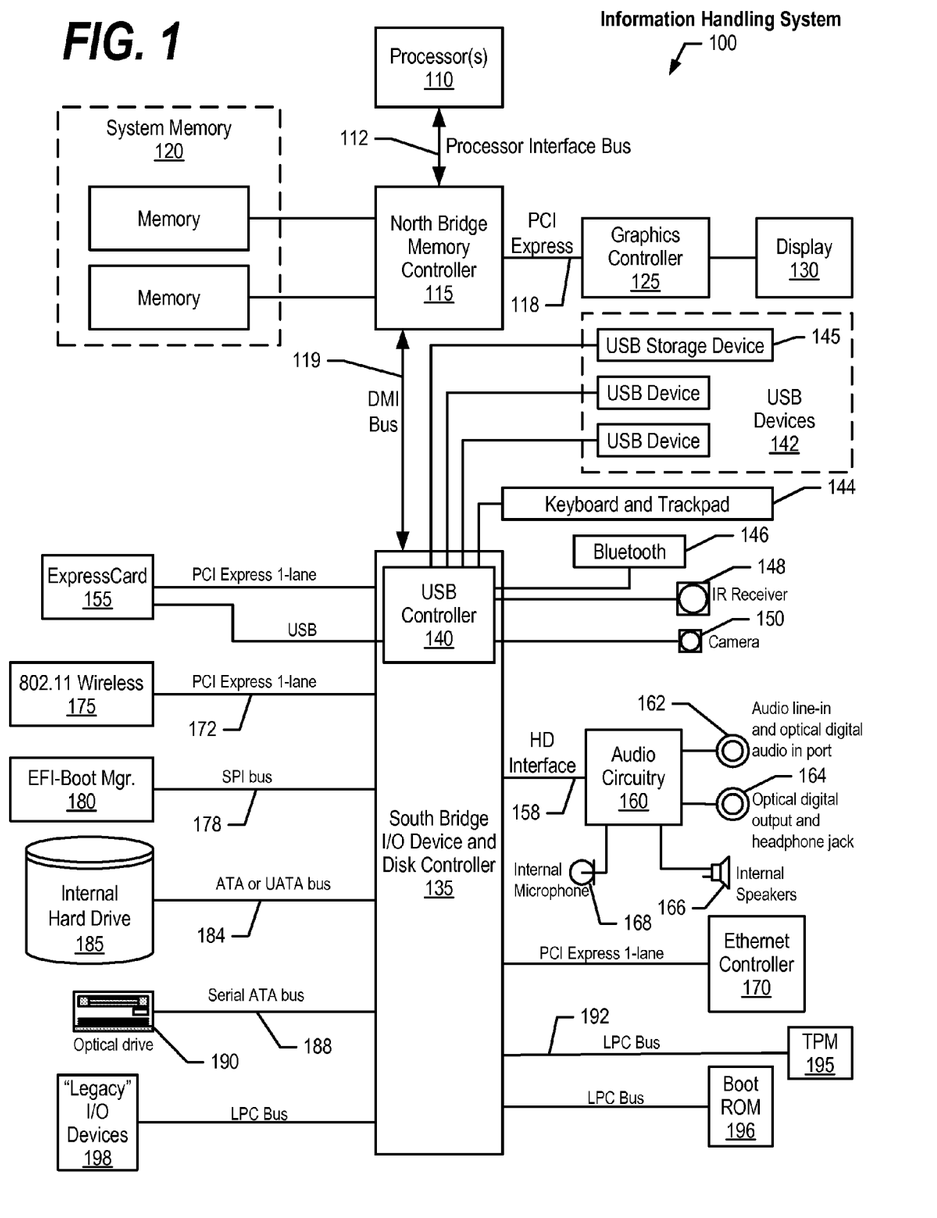
FIG. 1 is a block diagram of an information handling system in which the methods described herein may be implemented.

FIG. 1 illustrates information handling system 100, which is a simplified example of a computer system capable of performing the computing operations described herein. For example, information handling system 100 may be an electronically powered device tester that tests receiver devices on a production test floor. In another example, information handling system 100 may be utilized for computations associated with identifying adjusted bit error rates and adjusted test times in which to test a receiver device.

Information handling system 100 includes one or more processors 110 coupled to processor interface bus 112. Processor interface bus 112 couples processors 110 to Northbridge 115, which is also known as the Memory Controller Hub (MCH). Northbridge 115 connects to system memory 120 and provides a means for processor(s) 110 to access the system memory. Graphics controller 125 also connects to Northbridge 115. In one embodiment, PCI Express bus 118 connects Northbridge 115 to graphics controller 125. Graphics controller 125 connects to display device 130, such as a computer monitor.

Northbridge 115 and Southbridge 135 connect to each other using bus 119. In one embodiment, the bus is a Direct Media Interface (DMI) bus that transfers data at high speeds in each direction between Northbridge 115 and Southbridge 135. In another embodiment, a Peripheral Component Interconnect (PCI) bus connects the Northbridge and the Southbridge. Southbridge 135, also known as the I/O Controller Hub (ICH) is a chip that generally implements capabilities that operate at slower speeds than the capabilities provided by the Northbridge. Southbridge 135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 196 and "legacy" I/O devices (using a "super I/O" chip). The "legacy" I/O devices (198) can include, for example, serial and parallel ports, keyboard, mouse, and/or a floppy disk controller. The LPC bus also connects Southbridge 135 to Trusted Platform Module (TPM) 195. Other components often included in Southbridge 135 include a Direct Memory Access (DMA) controller, a Programmable Interrupt Controller (PIC), and a storage device controller, which connects Southbridge 135 to nonvolatile storage device 185, such as a hard disk drive, using bus 184.

ExpressCard 155 is a slot that connects hot-pluggable devices to the information handling system. ExpressCard 155 supports both PCI Express and USB connectivity as it connects to Southbridge 135 using both the Universal Serial Bus (USB) the PCI Express bus. Southbridge 135 includes USB Controller 140 that provides USB connectivity to devices that connect to the USB. These devices include webcam (camera) 150, infrared (IR) receiver 148, keyboard and trackpad 144, and Bluetooth device 146, which provides for wireless personal area networks (PANs). USB Controller 140 also provides USB connectivity to other miscellaneous USB connected devices 142, such as a mouse, removable nonvolatile storage device 145, modems, network cards, ISDN connectors, fax, printers, USB hubs, and many other types of USB connected devices. While removable nonvolatile storage device 145 is shown as a USB-connected device, removable nonvolatile storage device 145 could be connected using a different interface, such as a Firewire interface, et cetera.

Wireless Local Area Network (LAN) device 175 connects to Southbridge 135 via the PCI or PCI Express bus 172. LAN device 175 typically implements one of the IEEE 802.11 standards of over-the-air modulation techniques that all use the same protocol to wirelessly communicate between information handling system 100 and another computer system or device. Optical storage device 190 connects to Southbridge 135 using Serial ATA (SATA) bus 188. Serial ATA adapters and devices communicate over a high-speed serial link. The Serial ATA bus also connects Southbridge 135 to other forms of storage devices, such as hard disk drives. Audio circuitry 160, such as a sound card, connects to Southbridge 135 via bus 158. Audio circuitry 160 also provides functionality such as audio line-in and optical digital audio in port 162, optical digital output and headphone jack 164, internal speakers 166, and internal microphone 168. Ethernet controller 170 connects to Southbridge 135 using a bus, such as the PCI or PCI Express bus. Ethernet controller 170 connects information handling system 100 to a computer network, such as a Local Area Network (LAN), the Internet, and other public and private computer networks.

While FIG. 1 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

Figure 2:
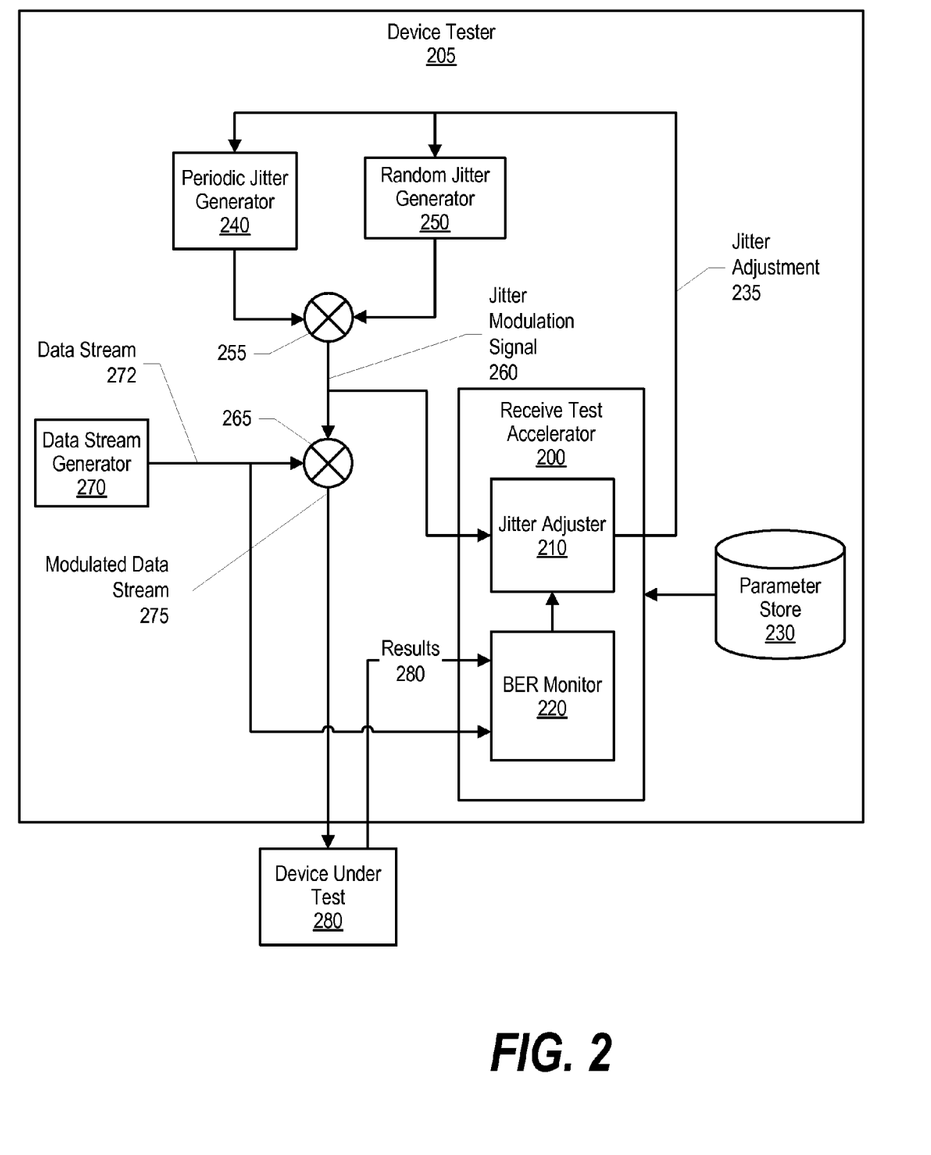
FIG. 2 is a diagram showing a receive test accelerator injecting increased jitter into a test system in order to test a device at a decreased amount of test time.

FIG. 2 is a diagram showing a receive test accelerator injecting increased jitter into a test system in order to test a device at a decreased amount of time. By extrapolating a baseline bit error rate to a less stringent (less rigorous), adjusted bit error rate, a device may be tested to the adjusted bit error rate in a shorter amount of test time.

Device Tester 205 includes receive test accelerator 200, which manages an amount of jitter for modulating a data stream (data stream 272) for testing device under test 280. Device under test 280 may be a receiver device such as a data serializer/deserializer (SERDES) that converts data between serial data and parallel interfaces. As one skilled in the art can appreciate, device under test 280 may be any electronic receiver device that receives digital data and specifies a bit error rate requirement, such as a wireless digital receiver or a wired digital receiver. Receive test accelerator 200 retrieves parameters from parameters store 230, which may include an adjusted jitter amount, an adjusted test time, and a maximum amount of allowable bit errors. The adjusted jitter amount corresponds to an increased amount of jitter, relative to a baseline jitter amount, in which to modulate a data stream (see FIGS. 5, 6, and corresponding text for further details). The adjusted test time is a decreased amount of time, relative to a baseline test time, in which to test device under test 280 in order to achieve an adjusted bit error rate. And, the maximum amount of allowable bit errors is the amount of bit errors that device under test 280 is allowed in order to pass the test. Parameters store 230 may be stored on a volatile or nonvolatile storage area, such as computer memory or a computer hard drive.

Receive test accelerator 200 includes jitter adjuster 210, which programs periodic jitter generator 240 and random jitter generator 250 with the adjusted jitter amount. In one embodiment, only periodic jitter generator 240 may be utilized and, in another embodiment, only random jitter generator 250 may be utilized. The periodic jitter and random jitter are combined at combiner 255, which produces jitter modulation signal 260.

Data stream generator 270 produces data stream 272 at a rate that corresponds to a data rate standard, such as a Peripheral Component Interconnect express (PCIe) standard of 1.25 GB/seconds. Jitter modulation signal 260 modulates data stream 272 at combiner 265, thus producing modulated data stream 275. Device under test 280 receives modulated data stream 275 and provides results 280 to bit error rate monitor 220. BER monitor 220 compares results 280 with data stream 272 in order to determine whether device under test 280 produced bit errors.

Jitter adjuster 210 monitors jitter modulation signal 260 in order to ensure that jitter modulation signal 260 adheres to the adjusted jitter amount. When jitter monitor 210 detects that jitter modulation signal 260 deviates from the adjusted jitter amount, jitter adjuster 210 dynamically instructs periodic jitter generator 240 and/or random jitter 250 to compensate accordingly. Jitter adjuster 210 also receives bit error indications from BER monitor 220 and may increase test time accordingly. For example, jitter adjuster 210 may increase the test time by 10% for every bit error up until the point at which the amount of bit errors is greater than the maximum amount of allowable bit errors.

In one embodiment, receive test accelerator 200 may be utilized to detect device under test 280's device margin. The device margin is the amount of input jitter that the receiver can tolerate above and beyond a device's particular specification requirement. For example, if device under test 280 fails an initial test, jitter adjuster 210 may incrementally decrease jitter adjustment 235 until device under test 280 passes the test. In turn, receive test accelerator 200 identifies device under test 280's margin and, for example, is able to bin device under test 280 accordingly.

Figure 3:
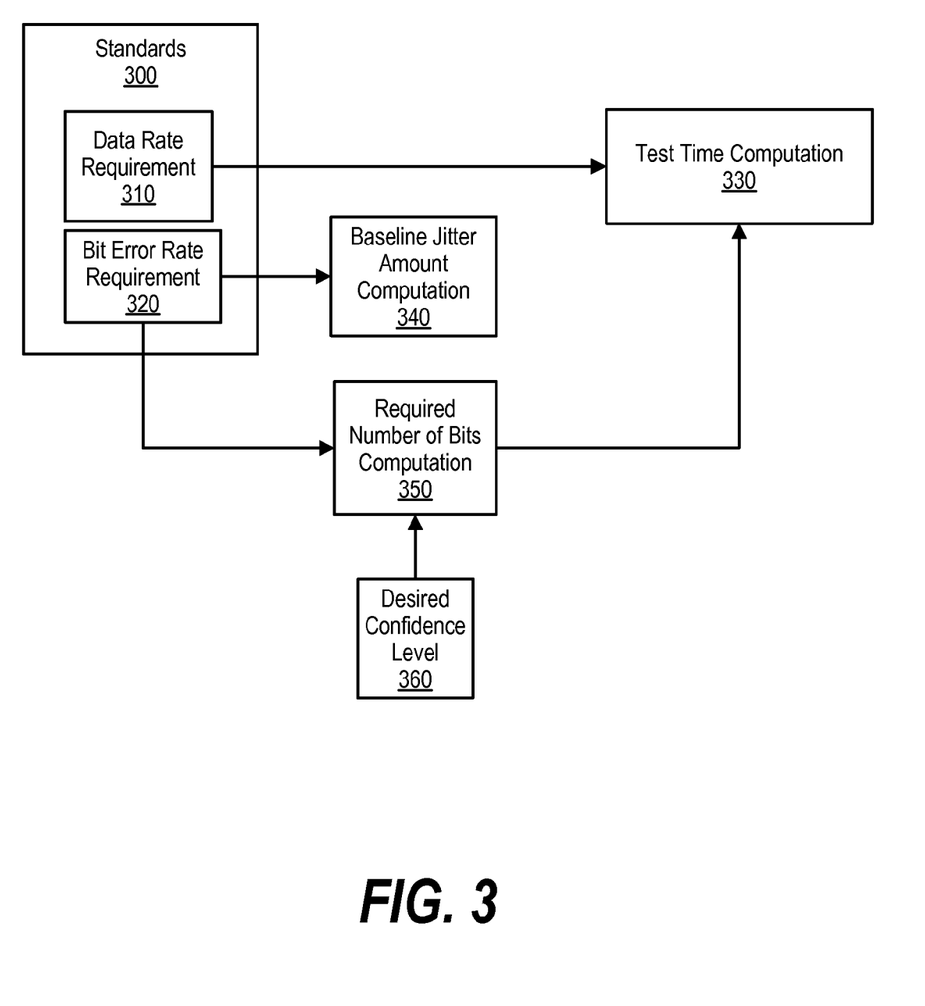
FIG. 3 is a diagram showing a process of computing a baseline test time utilizing industry standards and a desired confidence level.

FIG. 3 is a diagram showing a process of computing a baseline test time utilizing industry standards and a desired confidence level. Standards 300 include data rate requirement 310 and bit error rate requirement 320. For example, a Peripheral Component Interconnect express (PCIe) standard has data rate requirements of 1.25 GB/second, 3.0 GB/second, and 8.0 GB/second. In addition, the PCIe standard has a bit error rate requirement of $1e^{-12}$, which equates to receiving $10^{12}$ bits without errors. Since a higher data rate provides more data bits during a given timeframe than a lower data rate, data rate requirement 310 directly effects test time computation 330 (discussed below).

Figure 12:
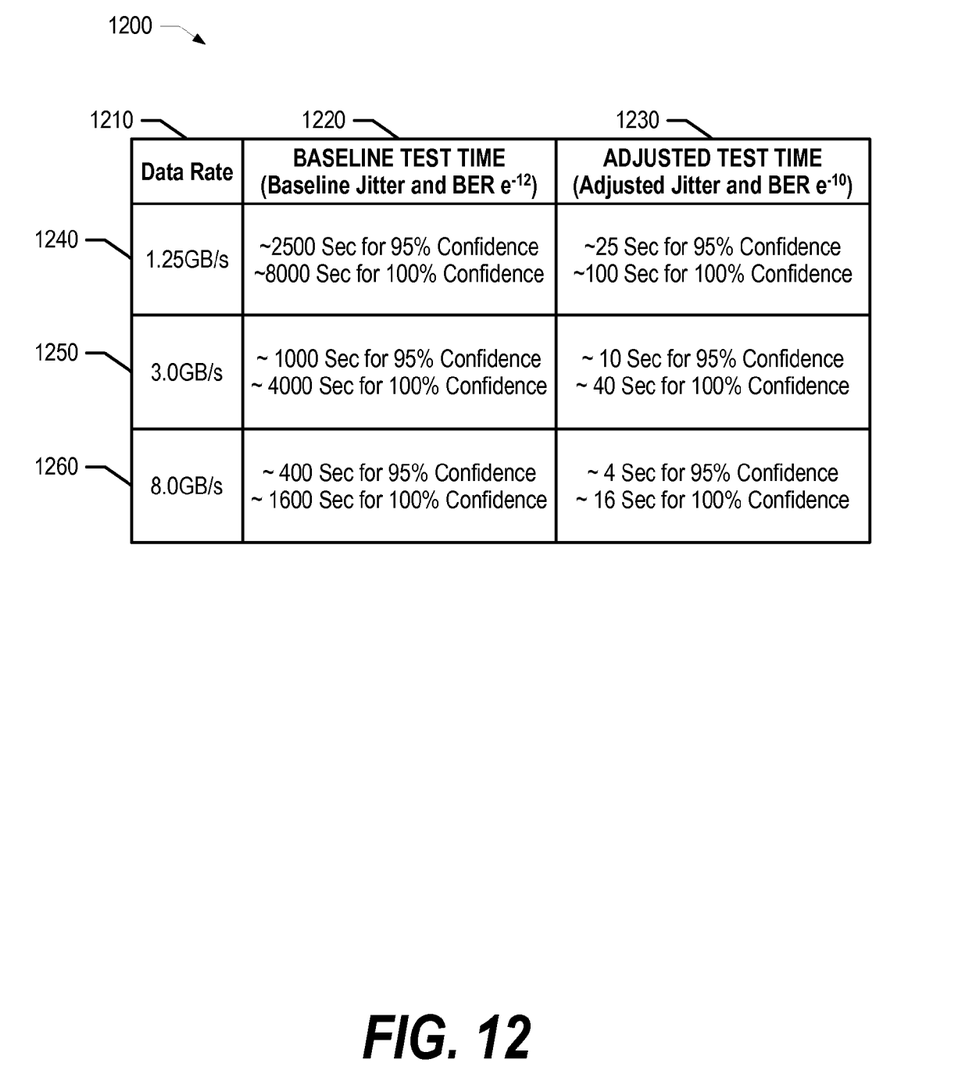
FIG. 12 is a table showing device test times utilizing a data stream that is modulated by a baseline jitter amount versus device test times utilizing a data stream that is modulated by an adjusted jitter amount.

Bit error rate requirement 320 contributes to baseline jitter amount computation 340 and number of bits required computation 350. Required number of bits computation 350 uses bit error requirement 320 and desired confidence level 360 in order to determine a number of bits in which to provide to a receiver during a test. Desired confidence level is a percent confidence that a system true bit error rate (BER) (e.g., if N=infinity) is less than the specified BER. The confidence level (CL) may be computed by the following equation:

$$CL = 1 - e^{-N \times BER_s} \times \sum_{k=0}^{E} \frac{(N \times BER_s)^k}{k!}$$

where BER is an industry-standard specified BER, BPS is the data rate in units of bits per second, T is time, E is measured bit errors, and N equals the number of transmitted bits (N=BPS×T). As can be seen, the confidence level increases as the number of transmitted bits increases without errors. Typically, desired confidence levels are at 95% or 100% (see FIG. 12 and corresponding text for further details).

Once the required number of bits is computed, test time computation 330 may be determined by dividing the number of bits required by data rate requirement 310. For example, if the number of bits required is 10 GB and the data rate requirement is 1 GB/second, the test time is 10/1=10 seconds.

Figure 4:
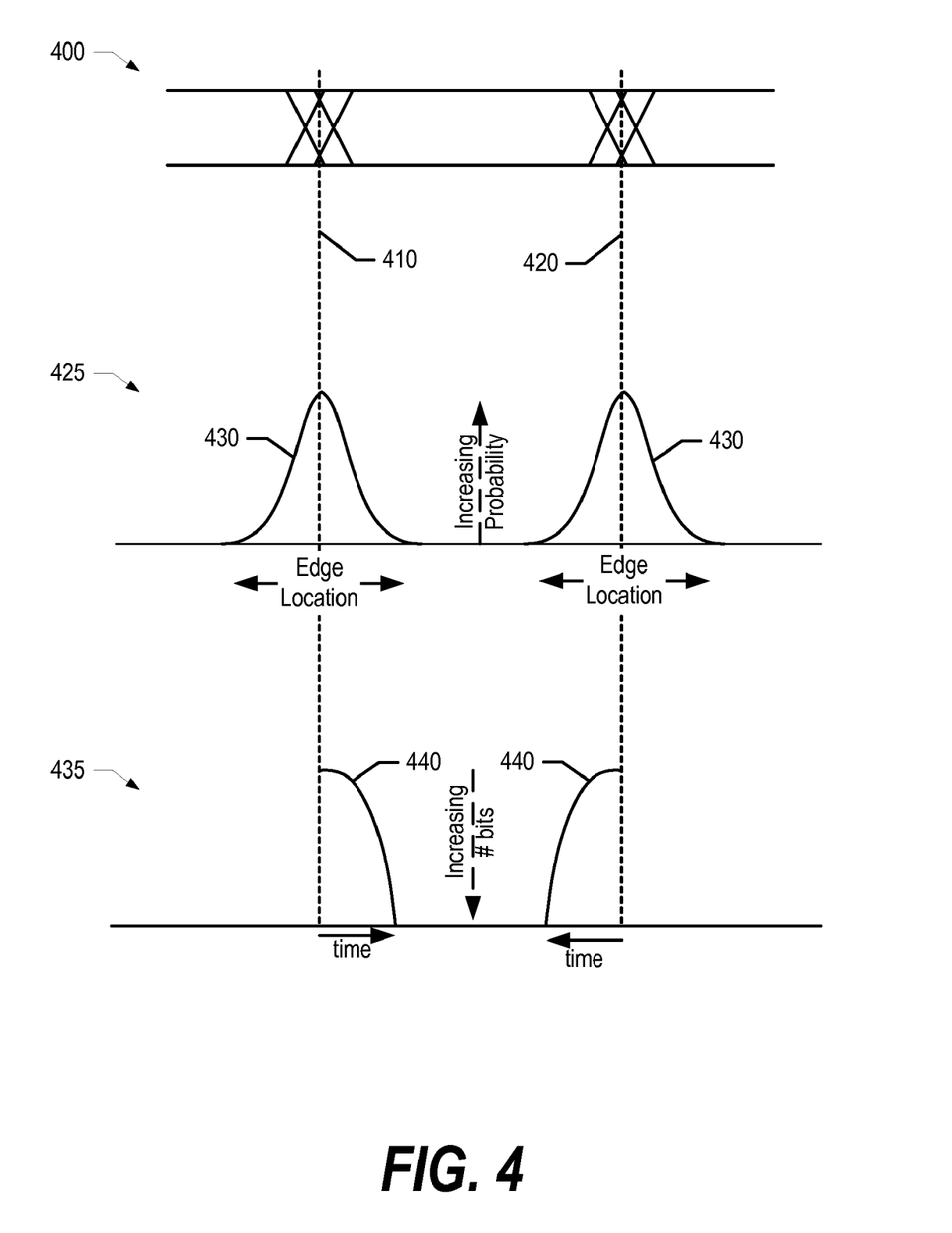
FIG. 4 shows a baseline eye diagram, a baseline probability density function curve, and a baseline bathtub curve that are based upon a data stream's baseline jitter.

FIG. 4 shows a baseline eye diagram 400, a baseline probability density function curve 425, and a baseline bathtub curve 435 that are based upon a data stream's baseline jitter. Baseline eye diagram 400 includes center points 410 and 420, which are "eyes" that result from right edge data signal jitter and left edge data signal jitter, respectively. Meaning, as a data stream provides data, the edges of the data fluctuate around a particular point due to "baseline jitter." For example, if a data stream provides data at a rate of 1.25 gigabytes (GB) per second, the data edges will not always be exactly at 1.25 GB/second. Sometimes they may be at 1.250001 GB/second or at 1.24999 GB/second. This imperfection creates baseline eye diagram 400, which graphically shows the amount of jitter that modulates a data stream. The baseline jitter may include random jitter, periodic jitter, or both random jitter and periodic jitter.

Random jitter is stochastic in nature and may be characterized by a Gaussian distribution. Random jitter continues to increase in time and, therefore, is "unbounded." Since random jitter is Gaussian in nature, random jitter may be characterized by the following probability distribution function:

$$G(t, \sigma, \mu) = \frac{1}{\sqrt{2\pi}\,\sigma} \exp\left(\frac{-(t-\mu)^2}{2\sigma^2}\right)$$

Taking both right edges and left edges into account, the following equation may be used to describe eye diagram 400:

$$H_i(t, \sigma_R, \mu_R, \mu_L, \sigma_L, N) = \left[\frac{1}{\sqrt{2\pi}\,\sigma_R}\exp\left(\frac{-(t-\mu_R)^2}{2\sigma_R^2}\right)\right] + \left[\frac{1}{\sqrt{2\pi}\,\sigma_L}\exp\left(\frac{-(t-\mu_L)^2}{2\sigma_L^2}\right)\right] + [N * ran(t)]$$

As can be seen from the above formula, the first part describes the right edge fluctuations, the second part describes the left edge fluctuations, and the third part describes statistical fluctuations.

Graph 425 is a baseline probability distribution function curve based upon eye diagram 400. Curves 430 show the distribution of the location of edges centered around center points 410 and 420. Curves 430 widen at a rate proportional to the amount of a data stream's total jitter. Meaning, the more a data stream fluctuates, the faster curves 430 widen, thus indicating a higher probability that edges occur away from the center points.

Figure 6:
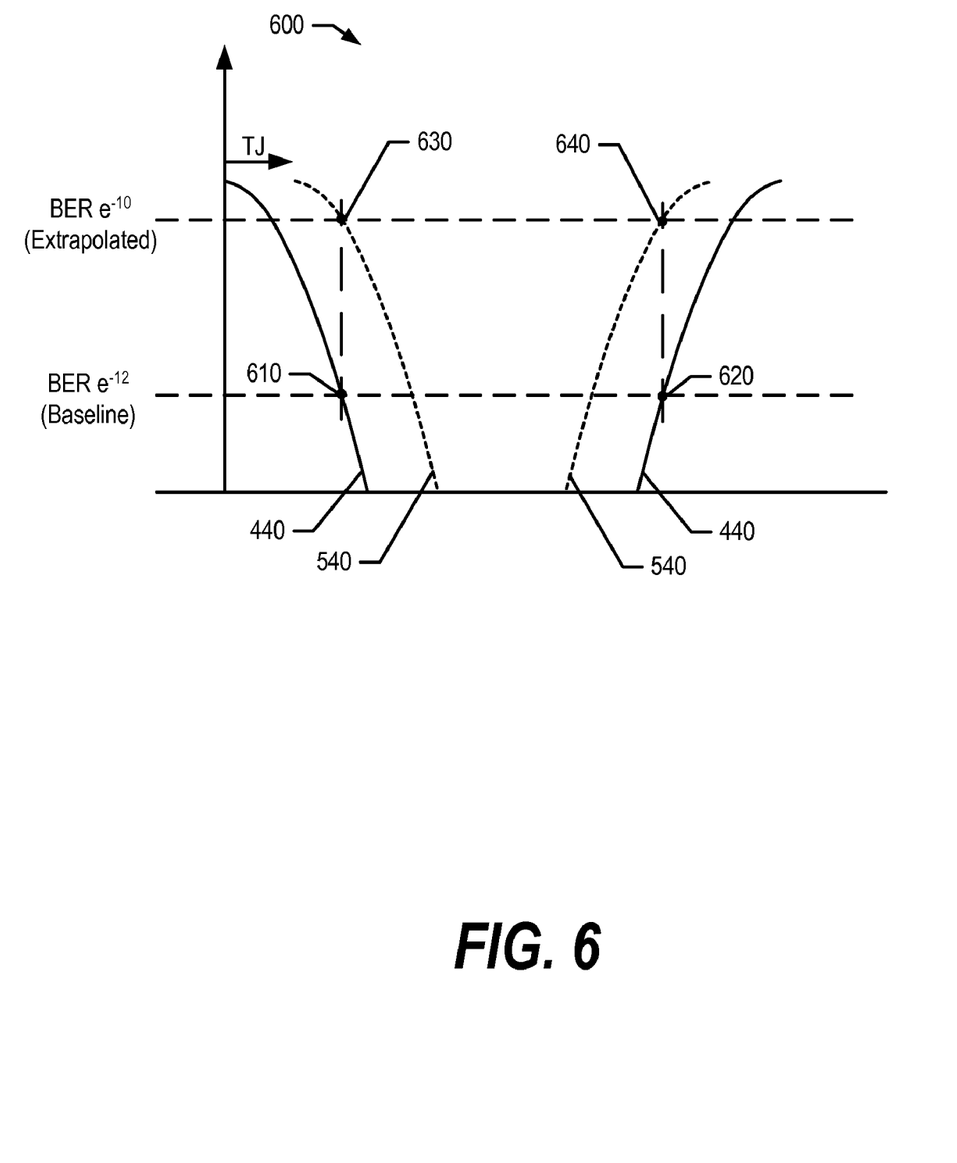
FIG. 6 is a diagram showing an extrapolation of a baseline bit error rate data point to an adjusted bit error rate data point.

Graph 435 is a baseline bathtub curve based upon integrating baseline probability distribution function curves 430. Using the formulas:

$$BER_R = \int_{\mu_R}^{\frac{\mu_R - \mu_L}{2}} \left[\frac{1}{\sqrt{2\pi}\,\sigma_R}\exp\left(\frac{-(t-\mu_R)^2}{2\sigma_R^2}\right)\right]$$

$$BER_L = \int_{\frac{\mu_R - \mu_L}{2}}^{\mu_L} \left[\frac{1}{\sqrt{2\pi}\,\sigma_L}\exp\left(\frac{-(t-\mu_L)^2}{2\sigma_L^2}\right)\right]$$

baseline bathtub curves 440 are generated. Curves 440 comprise a baseline set of data points and shows the probability of how close the right edge and left edge become as time progresses and more bits are injected into a device. As such, a baseline bit error rate data point may be plotted on baseline bathtub curve that signifies a point at which a device achieves a particular BER requirement (see FIG. 6 and corresponding text for further details).

Figure 5:
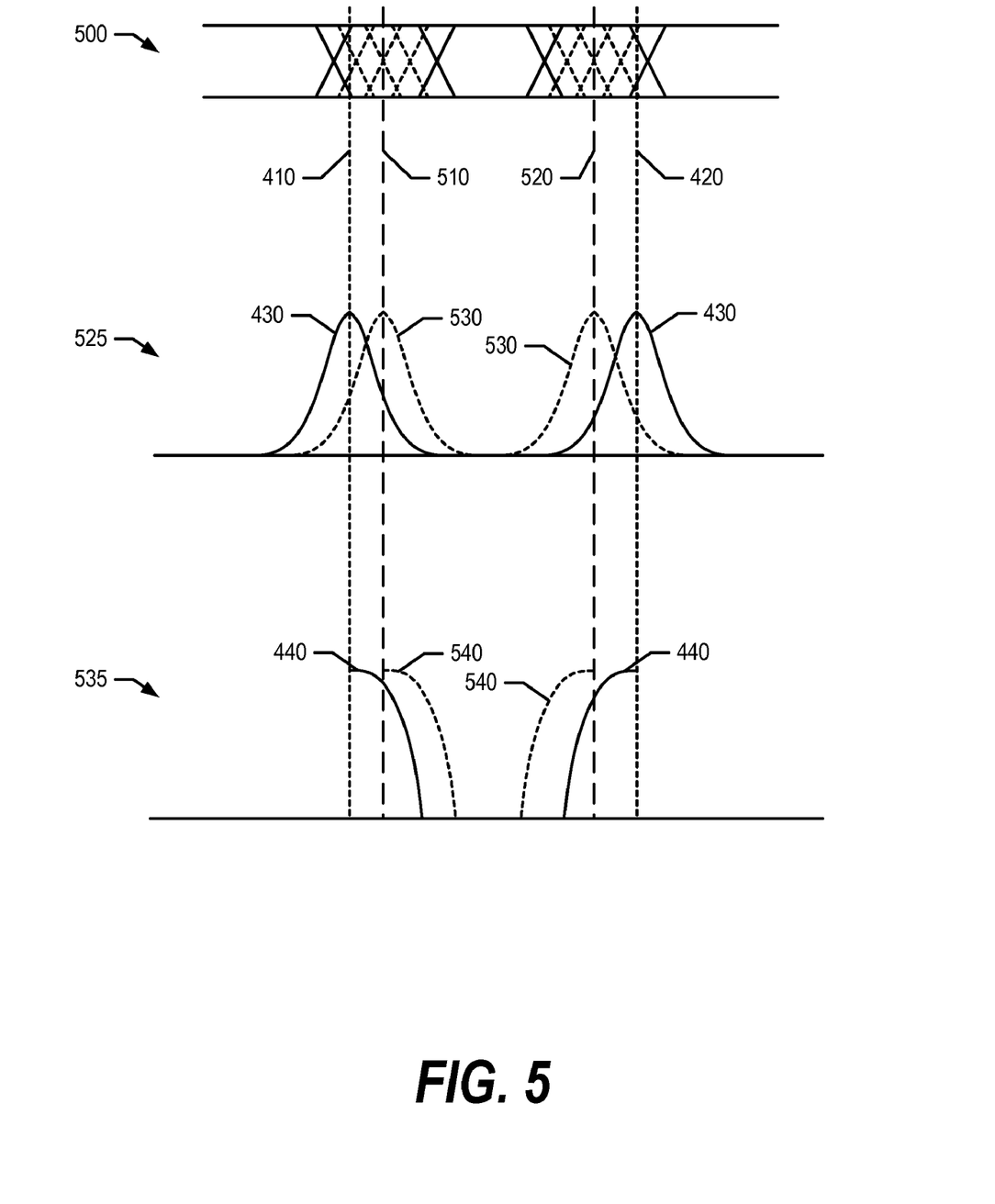
FIG. 5 shows an adjusted eye diagram, an adjusted probability density function curve, and an adjusted bathtub curve that are based upon a data stream that is modulated by an adjusted jitter amount.

FIG. 5 shows an adjusted eye diagram 500, an adjusted probability density function curve 525, and an adjusted bathtub curve 535 that are based upon a data stream that is modulated by an adjusted jitter amount. Compared with baseline eye diagram 400 in FIG. 4, adjusted eye diagram 500 corresponds to a data stream that is modulated by an adjusted (increased) jitter amount. As can be seen, center points 510 and 520 are shifted closer to each other relative to center points 410 and 420. The adjusted jitter amount may include increased random jitter, increased periodic jitter, or both increased random jitter and periodic jitter.

Graph 525 shows an adjusted probability density function curve (curves 530, which are based upon adjusted eye diagram 500) relative to baseline probability density function curve 430. Curves 530 show the distribution of the location of edges from adjusted eye diagram 500, which are centered on center points 510 and 520. As can be seen, adjusted probability density function curves 530's center points are closer together than baseline probability density function curves 430's center points due to the adjusted jitter amount.

Graph 535 shows an adjusted bathtub curve (curves 540, which are based upon integrating adjusted probability density function curves 530), relative to baseline bathtub curves 440. As can be seen, since center points 510 and 520 are closer together, adjusted bathtub curves 540 begin closer together and, as a result, converge sooner than baseline bathtub curves 440. In turn, an adjusted bit error rate data point that lies along adjusted bathtub curve 540 may be extrapolated from a baseline bit error rate data point that lies along baseline bathtub curve 440 (see FIG. 6 and corresponding text for further details).

FIG. 6 is a diagram showing an extrapolation of a baseline bit error rate data point, which resides on a baseline bathtub curve, to an adjusted bit error rate data point, which resides on an adjusted bathtub curve. As discussed previously, baseline bathtub curve 440 corresponds to a data stream's data edges when the data stream is modulated by a baseline jitter amount. And, adjusted bathtub curve 540 corresponds to the data stream's data edges when the data stream is modulated by an adjusted jitter amount.

Diagram 600 shows a baseline bit error rate equal to $e^{-12}$ on curves 440 at data points 610 and 620, which may correspond to a particular standard and confidence level. These points show the relative distance away from a center point that the data edges become by injecting an amount of data that corresponds to a bit error rate equal to $e^{-12}$ when the data is modulated by the baseline jitter amount.

Since reaching a particular bit error rate relates to the amount of fluctuations in a data stream's edges, baseline bit error rate data points 610 and 620 may be extrapolated onto curves 540, resulting in adjusted bit error rate data points 630 and 640. Since these points are higher on the curves, they correspond to a smaller amount of data injected into a device and, in turn, a less stringent bit error rate requirement. As can be seen, extrapolated bit error rate data points 630 and 640 correspond to an adjusted bit error rate equal to $e^{-10}$. As such, the adjusted bit error rate requires orders of magnitude less data for testing a device than the baseline bit error rate. In turn, by increasing a data stream's jitter amount, a device may be tested using significantly less data, thus requiring significantly less test time (see FIG. 11 and corresponding text for further details). When a device passes the test, the device is specified at the baseline bit error rate, which is more stringent than the adjusted bit error rate. Using the example in FIG. 6, the baseline bit error rate of $e^{-12}$ is more stringent than the adjusted bit error rate of $e^{-10}$.

Figure 7:
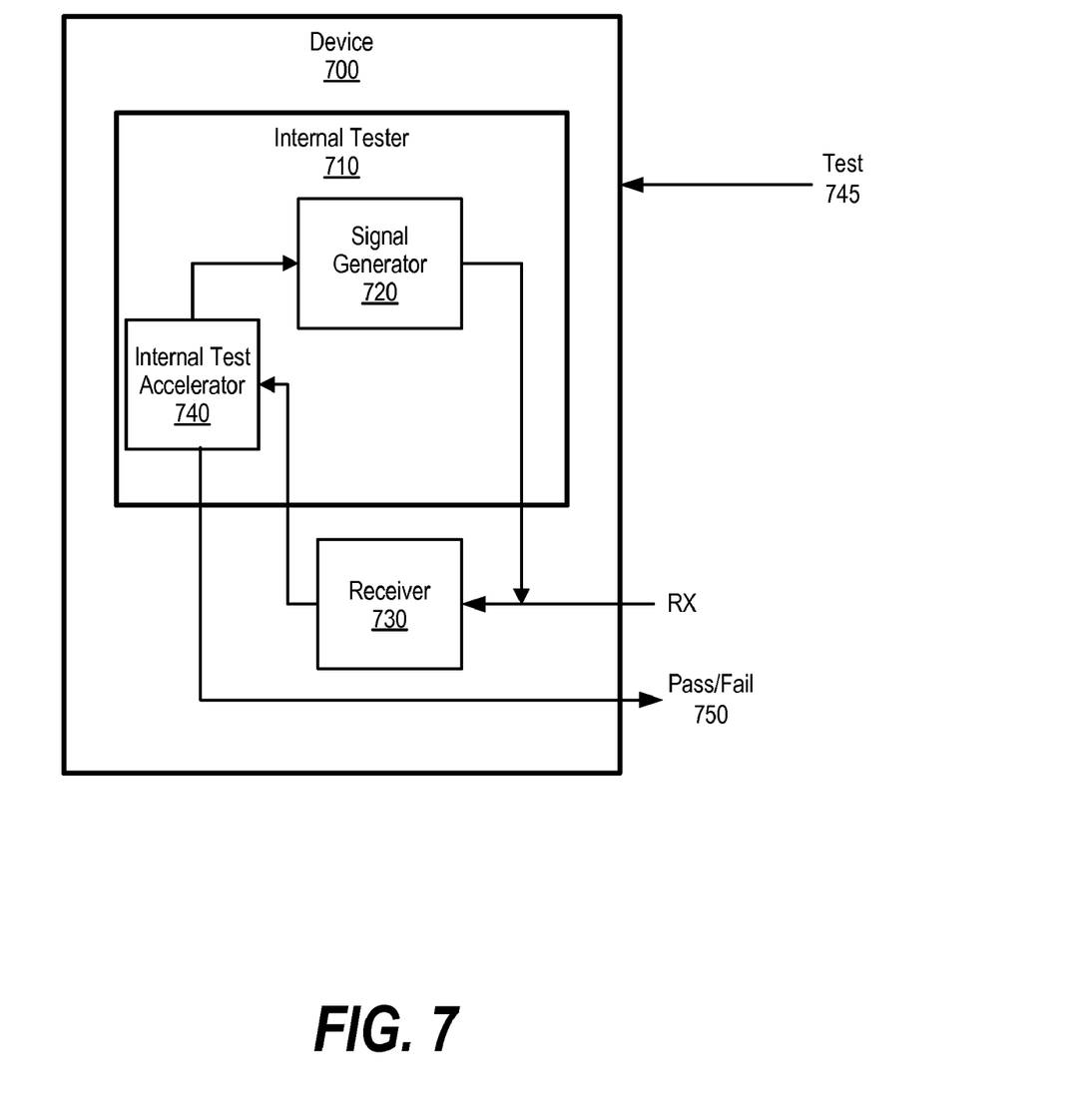
FIG. 7 is a diagram showing a test accelerator that is integrated into a device.

FIG. 7 is a diagram showing a test accelerator that is integrated into a device. Due to the fact that bit error rate tests are orders of magnitude shorter according to one embodiment of invention described herein, device 700 may include internal tester 710 and external Pass/Fail 750 signal that informs, for example, a field administrator as to whether the device passes a bit error rate test in the field.

Using the embodiment shown in FIG. 7, device 700 receives test signal 745 from an external source. For example, test signal 745 may originate from a remote tester such as that shown in FIG. 10. In turn, device 700 invokes internal test accelerator to perform a BER test. Internal test accelerator 740 begins the test by providing signal generator 720 with an adjusted jitter amount in which to modulate a data stream. In turn, signal generator 720 modulates the data stream at the adjusted jitter amount and provides the modulated data stream to receiver 730. Receiver 730 deciphers the data stream and provides results back to internal test accelerator, which includes a BER comparator. In one embodiment, signal generator 720 provides pre-defined data stream values (e.g., 101010101 . . . ) and, in this embodiment, internal test accelerator 740 knows data values that receiver 730 should provide. Based upon receiver 730's data output values, internal test accelerator 740 sets pass/fail signal 750 according to whether receiver 730 produced an allowable amount bit errors.

Figure 8:
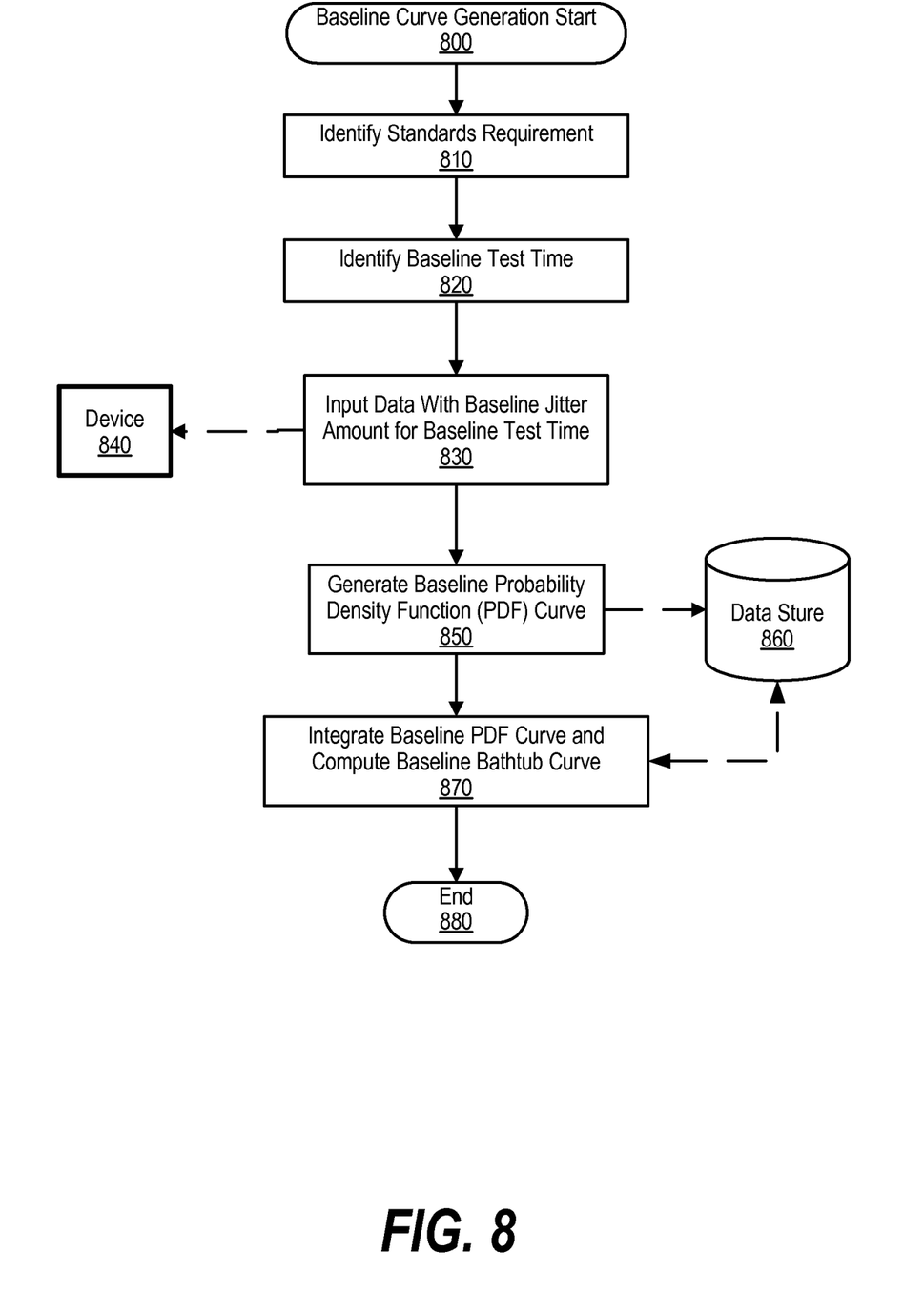
FIG. 8 is a flowchart showing steps taken in performing baseline tolerance testing for a device and creating a baseline set of data points for generating baseline curves.

FIG. 8 is a flowchart showing steps taken in performing baseline tolerance testing for a device and creating a baseline set of data points for generating baseline curves. Processing commences at 800, whereupon processing identifies standards requirements at step 810. For example, SATA (serial advanced technology attachment) has standards at particular data rates (1.5 GB/second, 2.5 GB/second, etc.) and each data rate has a corresponding minimum bit error rate requirement.

At step 820, processing identifies a baseline amount of time in which to test the device based upon the bit error rate requirement, the data rate, and a desired confidence level. For example, using a 1.25 GB/second data stream, in order to achieve a bit error rate of $e^{-12}$, the test time is 2,500 seconds for a 95% confidence level and 8,000 seconds for a 100% confidence level (see FIG. 12 and corresponding text for further details).

Next, processing inputs a data stream into device 840 that is modulated using a baseline jitter amount for the baseline test time (step 830). Processing tracks the modulated data stream and generates a baseline probability density function (pdf) that maps the data edges (see FIG. 4 and corresponding text for further details). In turn, processing integrates the baseline probability density function graph to produce a baseline bathtub curve (step 870). The baseline bathtub curve correlates a bit error rate to an amount of data that a device receives (see FIG. 4 and corresponding text for further details). Once processing creates the baseline bathtub curve, processing may compute an adjusted bathtub curve for a data stream that is modulated by an increased amount of jitter and, in turn reduce a device's test time (see FIGS. 5, 9, and corresponding text for further details). Baseline curve generation processing ends at 880.

Figure 9:
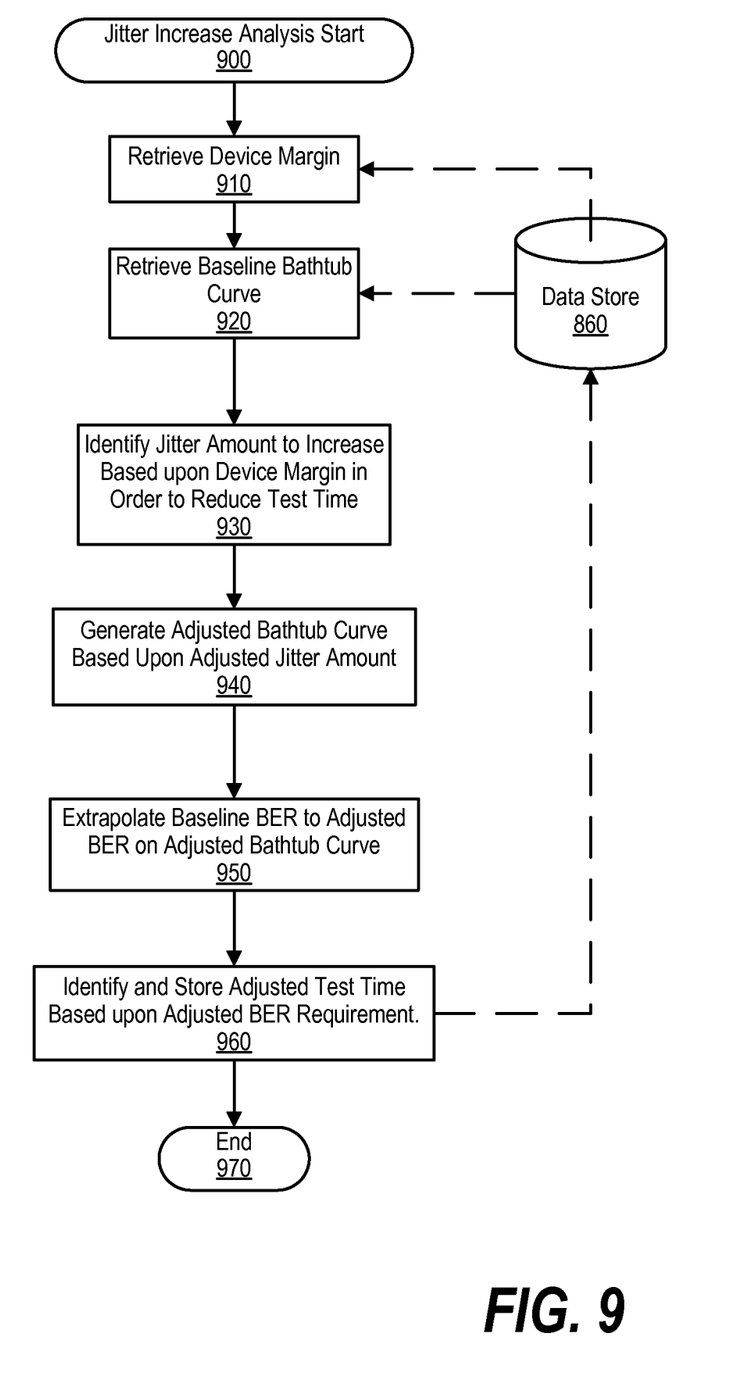
FIG. 9 is a flowchart showing steps taken in computing an adjusted jitter amount and an adjusted test time for testing a device.

FIG. 9 is a flowchart showing steps taken in computing an adjusted jitter amount and an adjusted test time for testing a device based upon baseline curve data generated during steps shown in FIG. 8. Processing commences at 900, whereupon processing retrieves device margin parameters from data store 860 at step 910. The device margin parameters include a total jitter allowed amount and other components such as random jitter and sinusoidal jitter, which provide guidance as to how much increased jitter the device can tolerate.

Next, at step 920, processing retrieves a baseline bathtub curve that was generated based upon a data stream that was modulated by a baseline jitter amount (see FIG. 8 and corresponding text for further details). At step 930, processing identifies an adjusted jitter amount in which to modulate the data stream based upon the device margin. For example, Serial Rapid IO (SRIO) is an industry standard that requires 18% Unit Interveral (UI), which means a data stream's eye is closed by 18% from random jitter. In this example, 0.18 UI of random (RJ) is injected into a system and additional sinusoidal jitter (SJ) is injected based upon the device margin.

Based upon the adjusted jitter amount, processing generates an adjusted bathtub curve by shifting the baseline bathtub curve corresponding to the adjusted jitter amount (see FIG. 5 and corresponding text for further details). Processing then extrapolates a baseline bit error rate data point on the baseline bathtub curve to an adjusted bit error rate data point on the adjusted bathtub curve (step 950). For example the baseline bit error rate data point may correspond to a BER requirement of $e^{-12}$, and the adjusted bit error rate data point may correspond to a BER of $e^{-10}$ (see FIG. 6 and corresponding text for further details).

Once processing identifies the adjusted bit error rate requirement, processing computes and stores an adjusted test time based upon the adjusted bit error rate requirement (step 960). Since the adjusted bit error rate requirement is orders of magnitude less than the baseline bit error rate requirement, the adjusted test time is orders of magnitude shorter than the baseline test time due to the fact that less bits are required to pass through the device (see FIG. 12 and corresponding text for further details). Processing ends at 970.

Figure 10:
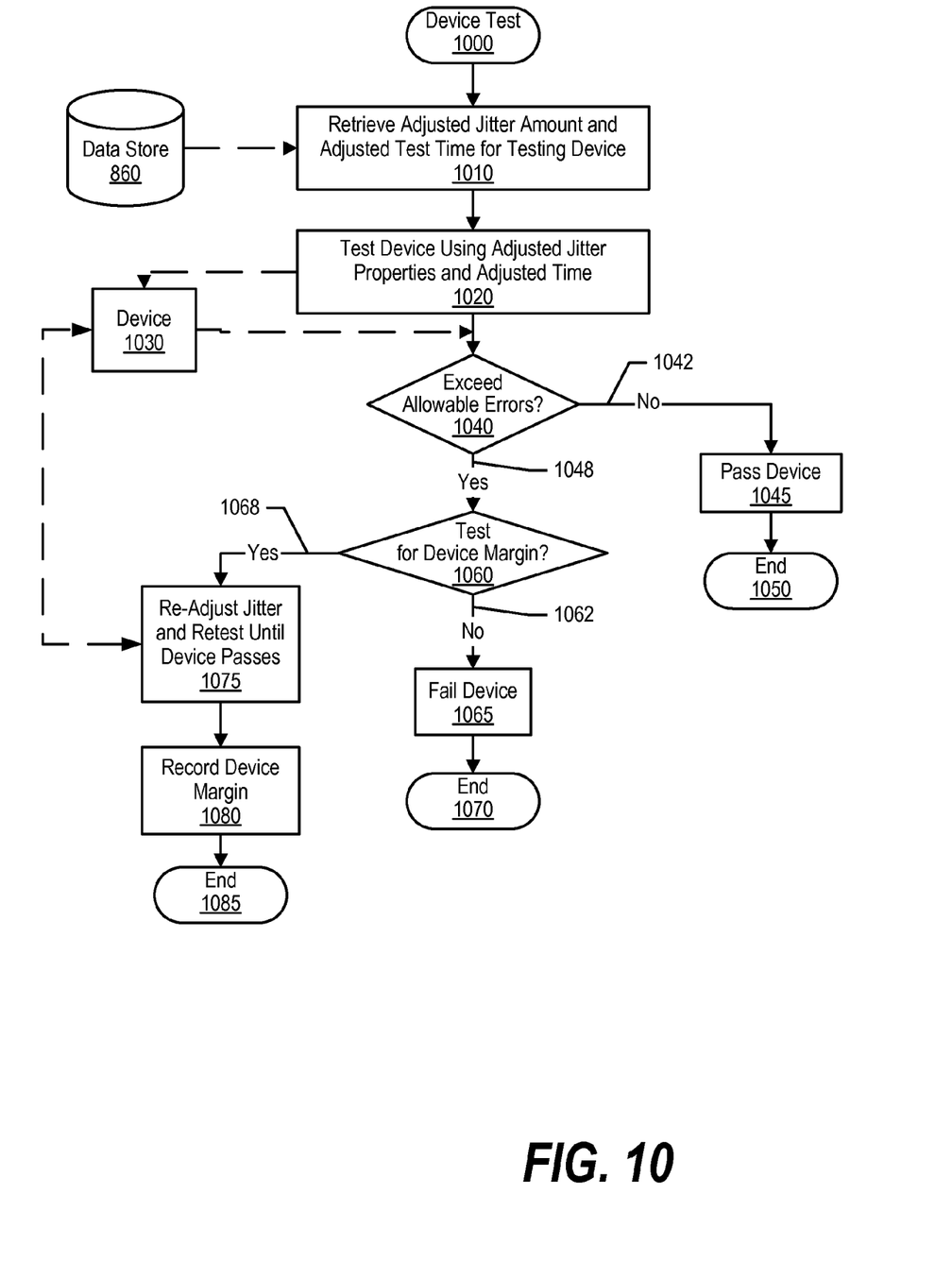
FIG. 10 is a flowchart showing steps taken in testing a device using a data stream that is modulated by an adjusted jitter amount.

FIG. 10 is a flowchart showing steps taken in testing a device using a data stream that is modulated by an adjusted jitter amount. In one embodiment, a production facility may modulate a data stream at the adjusted jitter amount and test devices at the adjusted test time, which may be orders of magnitude shorter than the device's corresponding baseline test time (see FIG. 12 and corresponding text for further details).

Processing commences at 1000, whereupon processing retrieves the adjusted jitter amount and adjusted test time from data store 860. At step 1020, processing tests device 1030 by modulating a data stream based upon the adjusted jitter properties. A determination is made as to whether the device exceeded a maximum amount of allowable errors (decision 1040). For example, a test may allow device 1030 to produce a maximum of two errors. In this example, if device 1030 produces an error, a test system may lengthen the test time in order to pass more bits through device 1030 and achieve the adjusted bit error rate.

If the device did not exceed the maximum amount of allowable errors, decision 1040 branches to "No" branch 1042, whereupon processing passes the device at 1045 and ends at 1050. On the other hand, if the device exceeded the maximum amount of allowable errors, decision 1040 branches to "Yes" branch 1048, whereupon a determination is made as to whether to perform a device margin test (decision 1060). For example, a device may not have the margin to withstand the adjusted jitter amount, but may have a device margin slightly less. In this example, a production tester may perform tests to identify the device's margin and bin the devices accordingly.

If processing should test for the device margin, decision 1060 branches to "Yes" branch 1068, whereupon processing sequentially lowers the adjusted jitter and re-tests the device until the device passes (step 1075). At step 1080, processing records the device margin and ends at 1085. On the other hand, if processing should not perform the device margin test, decision 1060 branches to "No" branch 1062, whereupon processing fails the device at 1065 and ends at 1070.

Figure 11:
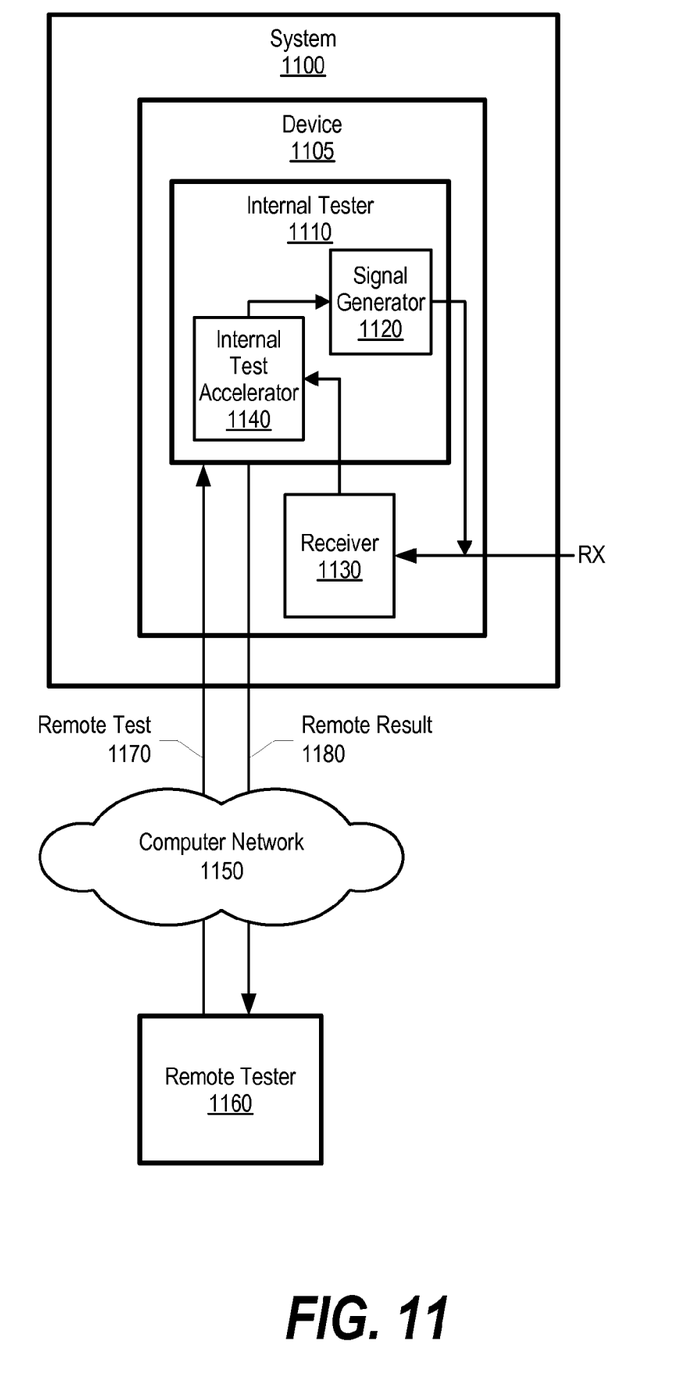
FIG. 11 is a diagram showing a remote system invoking an integrated receive test accelerator.

FIG. 11 is a diagram showing a remote system invoking an integrated receive test accelerator that is integrated into a device. Remote tester 1160 is utilized to remotely test device 1105 included in system 1100 through computer network 1150. In one embodiment, remote tester 1160 may be located at a cable company's facility and system 1100 may be located at a customer's household (e.g., cable modem). In this example, a technician may utilize remote tester 1160 to initiate an internal test (remote test 1170) for device 1105 through computer network 1150 (e.g., cable network). In this embodiment, internal tester 1110 utilizes internal test accelerator 1140 and signal generator 1120 to test receiver 1130 at the customer's household as discussed previously (see FIG. 7 and corresponding text for further details). In turn, internal tester 1110 sends a pass/fail result (remote result 1180) back to remote tester 1160.

In another embodiment, remote tester 1160 may be a portable device and system 1100 may be one of several receiver cards that are plugged into an equipment rack. In this example, an operator may connect remote tester 1160 into a central plug that proceeds to initiate internal tests for de-serializer devices included in each of the receiver cards.

FIG. 12 is a table showing device test times utilizing a data stream that is modulated by a baseline jitter amount versos device test times utilizing a data stream that is modulated by an adjusted jitter amount. Table 1200 includes columns 1210-1230 and rows 1240-1260. Column 1210 includes data rates for a data stream that is input to the device under test. Each row corresponds to, for example, a specification such as SATA or PCIe. Column 1220 includes test times in order to meet a BER of $e^{-12}$ based upon modulating a data stream by a baseline jitter amount. Column 1230 includes test times in order to meet a BER of $e^{-10}$ based upon modulating a data stream by an adjusted jitter amount. As can be seen, the test times in column 1230 are orders of magnitude less than the test times in column 1220. As one skilled in the art can appreciate, more bits are required to pass through a device in order to achieve a higher confidence level (95% versus 100% confidence). Thus more test time is required to achieve a higher confidence level.

While particular embodiments of the present invention have been shown and described, it will be obvious to those skilled in the art that, based upon the teachings herein, changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A method comprising:
   identifying an adjusted jitter amount and an adjusted test time in which to test a device, wherein the adjusted jitter amount and the adjusted test time correspond to an adjusted bit error rate that is extrapolated from a baseline bit error rate, the baseline bit error rate based upon a baseline jitter amount;
   combining a data stream with a jitter modulation signal that modulates the data stream at the adjusted jitter amount, the combining resulting in a modulated data stream; and
   testing the device, at the adjusted test time, using the modulated data stream, wherein, during the testing, dynamically adjusting the jitter modulation signal in order to ensure the data stream is modulated at the adjusted jitter amount.

2. The method of claim 1 further comprising:
   determining that the device produced less bit errors than a maximum allowable amount of bit errors; and
   in response to the determination, specifying that the device meets the baseline bit error rate.

3. The method of claim 1 wherein, at a specified data rate, the adjusted test time is shorter than a baseline test time and the baseline bit error rate is more stringent than the adjusted bit error rate.

4. The method of claim 1 further comprising:
   changing the adjusted jitter amount to an amount for the device to produce less bit errors than a maximum allowable amount of bit errors in order to establish a device margin for the device.

5. The method of claim 1 further comprising:
   generating the data stream internal to the device;
   modulating the data stream at the adjusted jitter amount internal to the device; and
   performing the testing internal to the device.

6. The method of claim 5 further comprising:
   receiving a remote signal from a remote location;
   in response to receiving the remote signal from the remote location, performing the generation, the modulation, and the testing internal to the device; and
   providing test results of the testing to the remote location.

7. The method of claim 1 wherein the device is a data serializer/deserializer.

8. A system comprising:
   a device that receives a data stream;

a receive test accelerator that provides a jitter adjustment to modulate the data stream, wherein the jitter adjustment corresponds to an adjusted bit error rate that is extrapolated from a baseline bit error rate, the baseline bit error rate based upon a baseline jitter amount; and an electronically powered device tester that combines the data stream with a jitter modulation signal corresponding to the jitter adjustment that modulates the data stream at the adjusted jitter amount, the combining resulting in a modulated data stream, wherein the electronically powered device further tests the device, at an adjusted test time, using the modulated data stream and, during the testing, the receive test accelerator dynamically adjusts the jitter adjustment in order to ensure the data stream is modulated at the adjusted jitter amount.

9. The system of claim 8 wherein the electronically powered device tester specifies that the device meets the baseline bit error rate after determining that the device produced less bit errors than a maximum allowable amount of bit errors.

10. The system of claim 8 wherein, at a specified data rate, the adjusted test time is shorter than a baseline test time and the baseline bit error rate is more stringent than the adjusted bit error rate.

11. The system of claim 8 wherein the receive test accelerator changes the adjusted jitter amount to an amount for the device to produce less bit errors than a maximum allowable amount of bit errors in order to establish a device margin for the device.

12. The system of claim 8 wherein the receive test accelerator and the electronically powered device tester are internal to the device.

13. The system of claim 8 wherein the device is a data serializer/deserializer.

14. A method comprising:
retrieving, from a storage area, a baseline set of data points that correlates a baseline jitter amount to a baseline amount of data, wherein the baseline amount of data includes a baseline bit error rate data point that corresponds to a baseline test time and a baseline bit error rate;
identifying an adjusted jitter amount in which to modulate a data stream;
generating, with a processor, an adjusted set of data points from the baseline set of data points based upon the adjusted jitter amount;
selecting, with the processor, a data point from the adjusted set of data points that correlates the baseline bit error rate data point to an adjusted bit error rate data point on the adjusted set of data points, the adjusted bit error rate data point corresponding to an adjusted test time in which to test the device type; and
testing a device, at the adjusted test time, using the data stream that is modulated by the adjusted jitter amount.

15. The method of claim 14 further comprising:
determining that the device produced less bit errors than a maximum allowable amount of bit errors;
in response to the determination, specifying that the device meets the baseline bit error rate; and
wherein, at a specified data rate, the adjusted test time is shorter than the baseline test time and the baseline bit error rate is more stringent than the adjusted bit error rate.

16. The method of claim 14 further comprising:
changing the adjusted jitter amount until the device produces less bit errors than a maximum allowable amount of bit errors in order to establish a device margin for the device.

17. The method of claim 14 further comprising:
generating baseline probability density function curve data by injecting the data stream that is modulated by the baseline jitter amount into the device;
providing baseline bathtub curve data that includes the baseline set of data points by integrating the baseline probability density function curve; and
generating adjusted bathtub curve data that includes the adjusted set of data points by shifting the baseline bathtub curve by an amount that corresponds to the adjusted jitter amount.

18. The method of claim 14 further comprising:
generating the data stream internal to the device;
modulating the data stream at the adjusted jitter amount internal to the device; and
performing the testing internal to the device.

* * * * *